(12) United States Patent
Chiu et al.

(10) Patent No.: US 11,787,621 B2
(45) Date of Patent: Oct. 17, 2023

(54) RETICLE POD AND WEAR PARTS THEREOF

(71) Applicant: GUDENG PRECISION INDUSTRIAL CO., LTD., New Taipei (TW)

(72) Inventors: Ming-Chien Chiu, New Taipei (TW); Jain-Ping Sheng, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 122 days.

(21) Appl. No.: 16/903,337

(22) Filed: Jun. 16, 2020

(65) Prior Publication Data
US 2021/0292083 A1    Sep. 23, 2021

(30) Foreign Application Priority Data

Mar. 23, 2020 (TW) ................................ 109109682

(51) Int. Cl.
| | |
|---|---|
| *H01L 21/67* | (2006.01) |
| *B65D 85/48* | (2006.01) |
| *H01L 21/673* | (2006.01) |
| *G03F 1/66* | (2012.01) |
| *G03F 7/00* | (2006.01) |

(52) U.S. Cl.
CPC ............ *B65D 85/48* (2013.01); *G03F 1/66* (2013.01); *G03F 7/70741* (2013.01); *H01L 21/67359* (2013.01)

(58) Field of Classification Search
CPC . B65D 85/48; B65D 25/107; H01L 21/67359; G03F 7/70741; G03F 1/66

USPC ................................................... 206/710, 454
See application file for complete search history.

(56) References Cited

U.S. PATENT DOCUMENTS

| | | | | |
|---|---|---|---|---|
| 4,225,043 A | * | 9/1980 | Lastik ................. | B65D 25/107 206/386 |
| 7,922,000 B2 | * | 4/2011 | Hyobu ............. | H01L 21/67346 211/41.18 |
| 2010/0032331 A1 | * | 2/2010 | Lu ..................... | H01L 21/67005 206/454 |

(Continued)

FOREIGN PATENT DOCUMENTS

| | | |
|---|---|---|
| CN | 101661226 B | 7/2011 |
| JP | 2003-264225 A | 9/2003 |
| JP | 2011-166065 A | 8/2011 |

(Continued)

*Primary Examiner* — Steven A. Reynolds
(74) *Attorney, Agent, or Firm* — Cheng-Ju Chiang (57) ABSTRACT

The invention provides a reticle pod, in particular the reticle pod with wear parts. The reticle pod is a large-size reticle pod and includes a vertical accommodation space for accommodating reticles. The reticle pod mainly includes a cover and a box. The box is used to combine with the cover to form an internal space in order to accommodate reticles. Guiding members are disposed outside the box, and the guiding members can help guide the relative position of the box and the cover. The contact surfaces of the box contacting the upright reticles are disposed with at least two slots, and each of the slot is configured with at least one wear part. The wear part module further includes a first wear part disposed on the upper portion of the slot and a second wear part disposed on the lower portion of the slot.

6 Claims, 9 Drawing Sheets

(56) References Cited

U.S. PATENT DOCUMENTS

2015/0101953 A1* 4/2015 Yue .................... B65D 25/107
220/587

FOREIGN PATENT DOCUMENTS

| KR | 20-0442873 Y1 | 12/2008 |
| KR | 10-2016-0055140 A | 5/2016 |
| TW | 200537583 A | 11/2005 |
| TW | 201010916 A | 3/2010 |
| WO | 01/81203 A1 | 11/2001 |

* cited by examiner

RETICLE POD AND WEAR PARTS THEREOF

TECHNICAL FIELD

The present invention relates to a reticle pod which has wear parts. Specifically, the aforementioned reticle pod accommodates large reticles in an upright position in order to reduce the particles formation.

BACKGROUND OF RELATED ARTS

In recent years, Optical Lithography plays an important role in rapid development of semiconductor technology, and the definition of patterns also depends on this optical lithography. In the application of optical lithography in semiconductor industry, the circuit design is made into reticles with specific shapes that can transmit light thereby using the exposure principle, and the light source is projected onto the silicon wafer through reticles to expose a specific pattern. Since any dust particles (such as particles, dust or organic matter) deposed on reticles will deteriorate the quality of projection of imaging. Thus, the reticles used to generate patterns must be kept entirely clean. The use of Standard Mechanical Interface (SMIF) reduces the impact of the particle issue during the process of the storage and transportation of semiconductors.

According to the above-mentioned concept, wafers and reticles must be placed in carriers with high cleanliness, superior air tightness, low outgassing and antistatic protection (electrostatic discharge, ESD), such as Cassette, FOUP, FOSB, Mask Package or Reticle SMIF Pod (RSP). Those containers/carriers effectively prevent wafers and reticles from being contaminated, and simultaneously ensuring high cleanliness of wafers and reticles and high production of semiconductor products.

Furthermore, when the semiconductor factory enters an advanced-level manufacturing process, not only the electrostatic effect but also the electromagnetic pulse (EMI) in the semiconductor factory might harm the wafers and reticles. Especially during the storage stage, it is even more difficult to anticipate changes in the surrounding environment. Consequently, there is also an important issue for preventing damage to wafers and reticles caused by electrostatic effects (ESD) and electromagnetic pulses (EMI).

However, the traditional way of wafers/reticles carried in the carriers are mostly lying flat which leads to the large contact surface, and thus requires multiple wear-resistant parts, supporting parts or pressing units to prevent wafers or reticles from colliding with the carriers, which leads to the produce or adhesion of particles. In other words, the way to provide wafer/reticles carriers with brilliant antistatic effect, wear resistance and high cleanliness is a crucial issue.

SUMMARY

In view of the deficiencies of the prior arts, the present invention provides a carrier, which can carry wafer or reticle and effectively solve the problems that the traditional carriers are not wear resistant enough. To achieve the object mentioned above, the present invention provides a wear parts module, which is formed on a plurality of slots in substrate containers, comprising: a first wear part, which is configured on one side of the slot; and a second wear part, which is configured on the other side of the slot.

In accordance with one aspect of the present invention based on the concept above, the present invention further provides a reticle pod, which comprises: a box, which includes a space for accommodating reticles in an upright position; a cover, which corresponds to the box with at least one guiding member; a plurality of slots, which are disposed in the space in pairs; a wear parts module configured on the slots; the wear parts module comprising: a first wear part, which is configured on one side of the slot; and a second wear part, which is configured on the other side of the slot.

Embodiments of the invention are illustrated by way of example, and not by way of limitation, in the figures of the accompanying drawings in which like reference numerals refer to similar elements.

DETAILED DESCRIPTION OF THE INVENTION

In order to understand the technical features and practical efficacy of the present invention and to implement it in accordance with the contents of the specification, hereinafter, preferred embodiments of the present invention will be described in detail with reference to the accompanying drawings.

Figure 3:
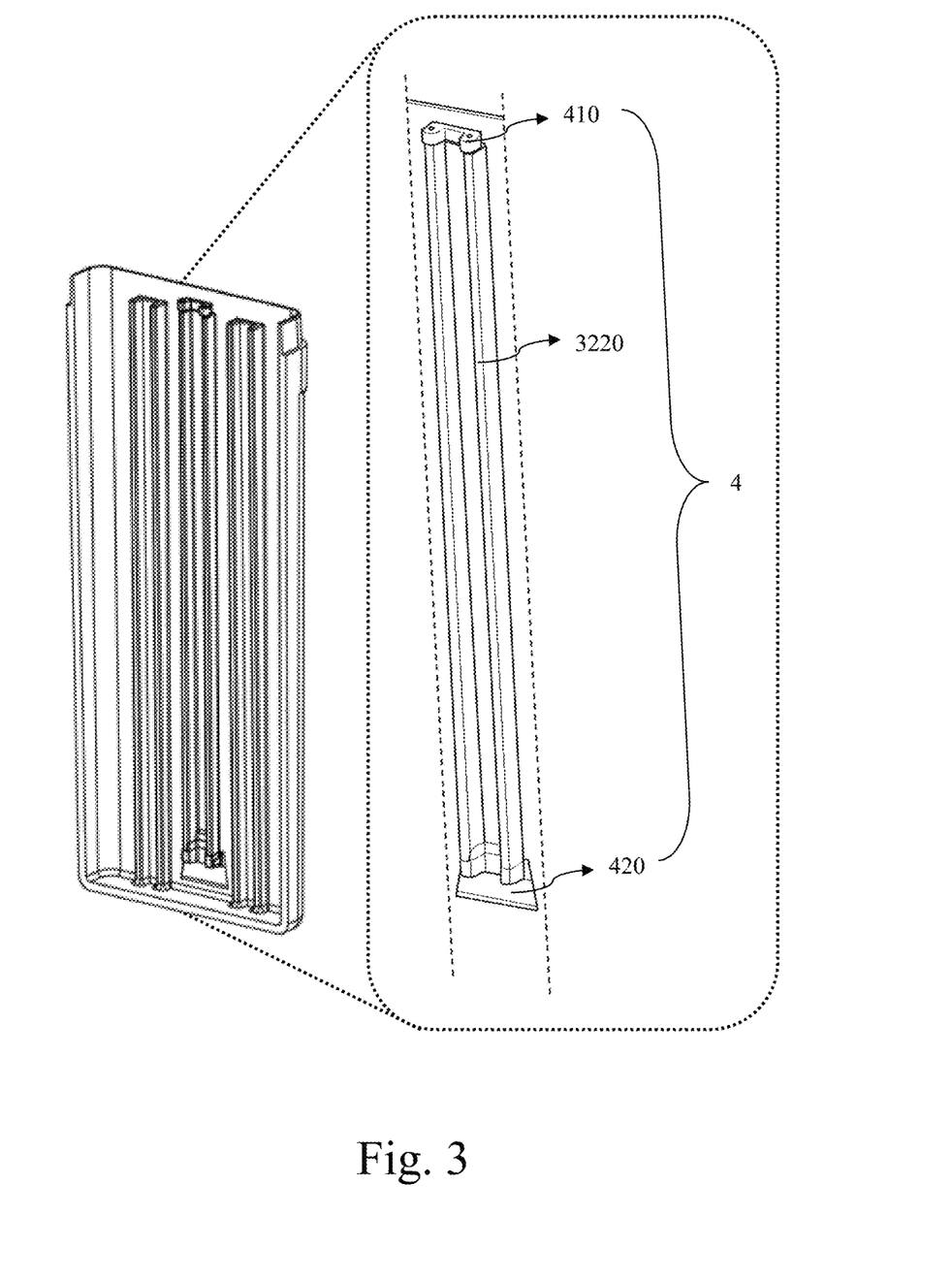
FIG. 3 illustrates a schematic diagram of the slots and the wear parts module of the preferred embodiment of the present invention.

First of all, please refer to FIG. 3; wherein FIG. 3 is a schematic diagram of the slots and the wear parts module of one embodiment of the present invention. FIG. 3 demonstrates one of the embodiments which provides a wear parts module disposed in some sorts of substrate containers. In the present embodiment, said substrate containers include Reticle Containers such as the reticle pod 3 as FIG. 1 shown or the Substrate Carriers which receive substrates such as wafers.

According to the aforementioned substrate containers, Reticle Containers refer to Mask Package, Reticle SMIF Pod (RSP) or EUV Pod, and it is not intended to be exhaustive or to be limited to the precise forms disclosed; while Substrate Carriers refer to Cassette, FOUP or FOSB, and it is not intended to be exhaustive or to be limited to the precise forms disclosed.

Therefore, it should be provided with the abovementioned substrate containers to demonstrate the embodiment of the wear parts module 4. The substrate containers include a space, which accommodates reticles and a plurality of slots 3220 in pairs. The first wear part 410 is disposed on one side of the slot 3220 which is generally the entrance of chips-like semiconductors such as reticles or wafers while the second wear part 420 is disposed on the other side. In order to make the present invention become more apparent to those ordinarily skilled in the art, it is hereinafter introduced with the reticle pod 3 by way of example to specify the embodiment of the substrate containers, the slots 3220, the first wear part 410 and the second wear part 420.

Figure 1:
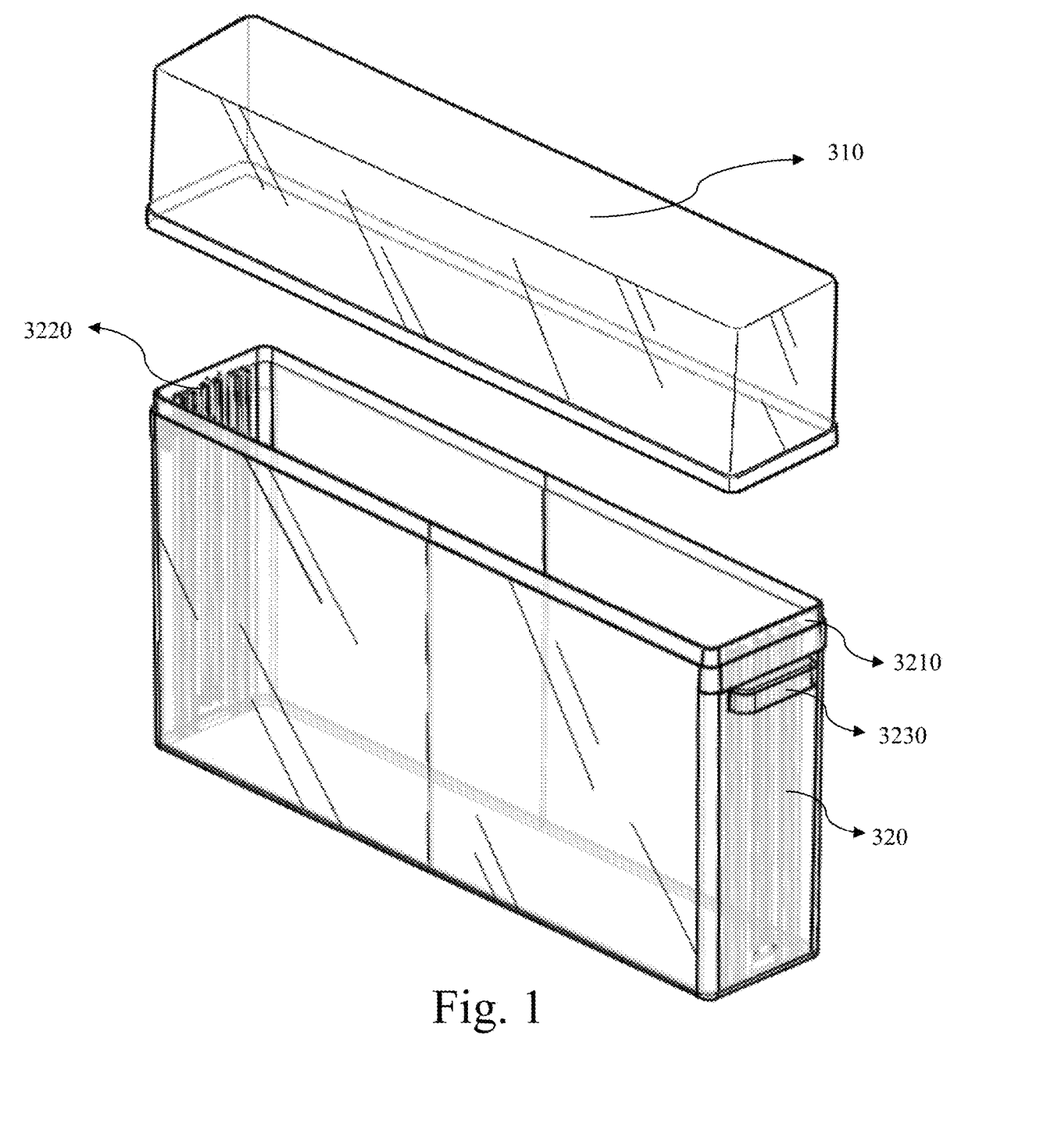
FIG. 1 illustrates a schematic diagram of a reticle pod of a preferred embodiment of the present invention.

According to the abovementioned embodiment of the reticle pod 3, please refer to FIG. 1, FIG. 1 is a schematic diagram of a reticle pod 3 according to one embodiment of the invention. In the embodiment, it is provided with a reticle pod 3 which is used to receive large size of the reticles. In general, the large size of the reticles refers to product specifications in panel industry. The specific sizes of reticles could be as large as 800 mm to 960 mm, thus the certain kind of reticles are possibly not able to be transmitted or stored by the traditional small reticle pods. Instead, it is recommended to use the large reticle rods.

Figure 2:
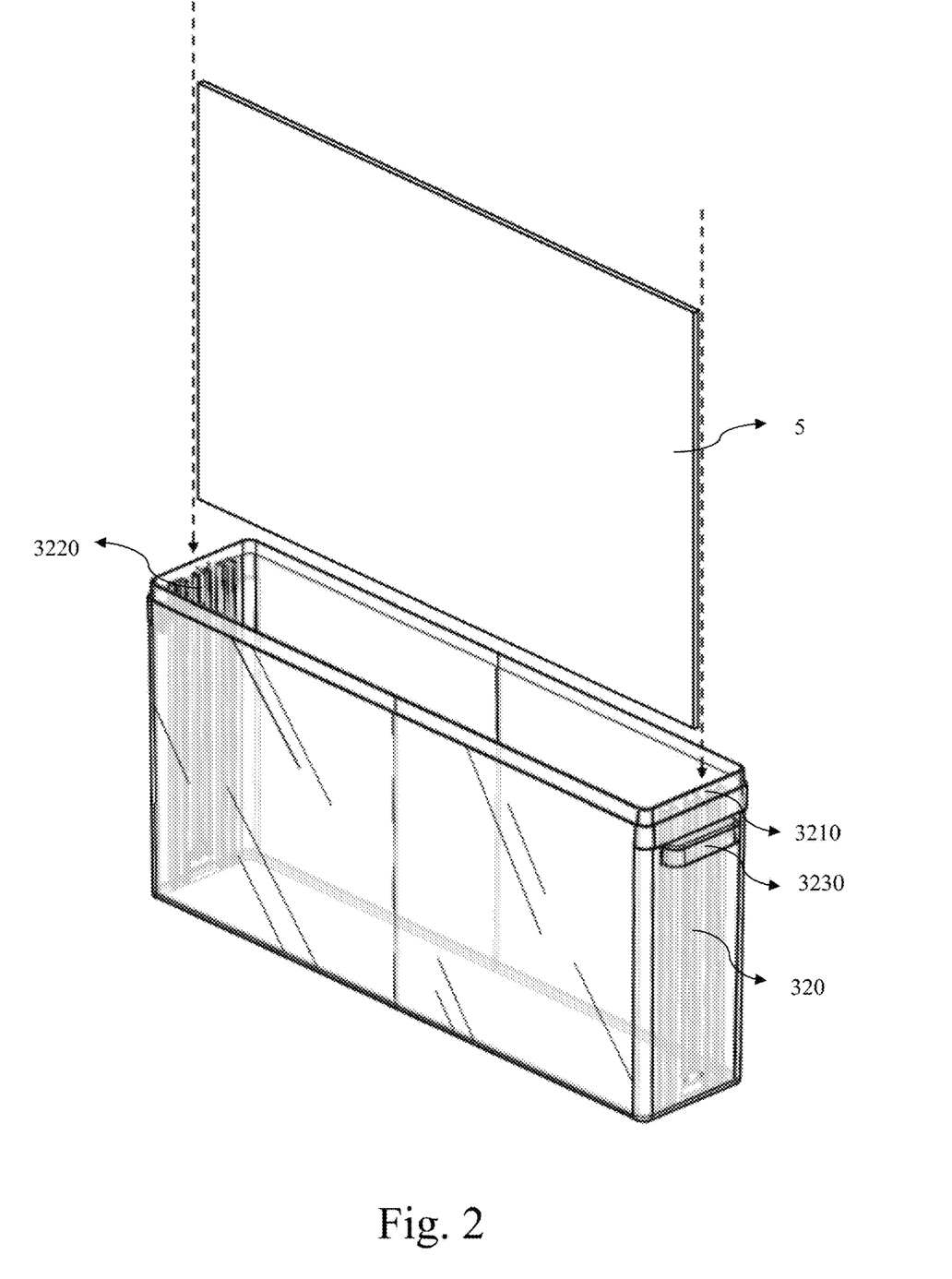
FIG. 2 illustrates a schematic diagram of the reticle and the reticle pod of the preferred embodiment of the present invention.

In the embodiment, the large reticles 5 stand upright in the reticle pods 3 in order to enable the storage and transmission of large reticle pods; in other words, reticles are accommodated in the reticle pod 3 via a vertical accommodation space of the box. The reticle pod 3 is comprised of a cover 310 and a box 320, and the box 320 corresponds with the cover 310 to form the vertical space to accommodate reticles 5 (as shown in FIG. 2). As shown in FIG. 1, the cover 310 and the box 320 of reticle pod 3 are formed in one body and all are made of transparent material. Additionally, the cover 310 and the box 320 are made of electrostatic discharge material, such as Acrylonitrile Butadiene Styrene (ABS).

Moreover, please refer to FIG. 1 and FIG. 2, guiding members 3210 are disposed on the upper edge of the box 320 for guiding the box 320 to appropriately match with the cover 310, which increase the sealing performance between the box 320 and the cover 310. In other possible embodiments, guiding members 3210 can be any type of strips including rubber strips without specific limitation to increase the stability and sealing performance thus reduce the particles formation during the transmission process. In the present embodiment, handles 3230 are disposed outside the box 320 in pairs to facilitate the moving of the reticle pod 3. In addition, at least two slots 3220 are disposed on the surface of the side of the box to contact the reticles 5. Please refer to FIG. 2, a plurality of slots 3220 are positioned parallel to one another on the side surface inside the box, which enables the reticles 5 to be placed into the box in an upright position. Then, the reticles 5 are arranged in parallel in the reticle pod 3 to reduce the formation of particles when they rub against each other.

Figure 9:
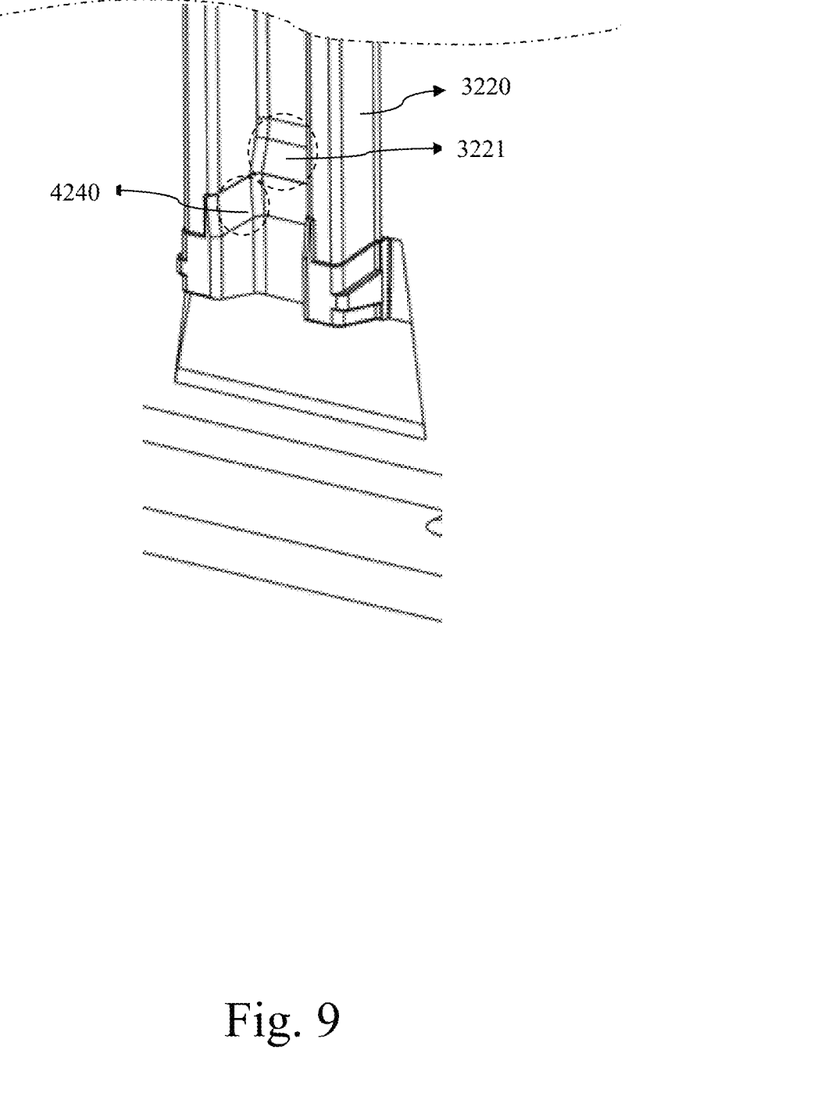
FIG. 9 illustrates a schematic diagram of disposing the second wear part onto the slots of one embodiment of the present invention.

Please refer to FIG. 3, at least one wear parts module 4 is configured on the slots 3220. In one of the embodiments, the wear parts module 4 comprising a first wear part 410 and a second wear part 420, which are configured on the top of the slots 3220 and the bottom of the slots 3220 respectively. Further, please refer to FIG. 9. In the present embodiment, a third bevel 3221 is configured on the connection between the middle portion of slot 3220 and the second wear part 420. The third bevel 3221 facilitates the loading of the reticles 5 into the reticle pod and reduces the consequent friction. In addition, the first wear part 410 and the second wear part 420 are made of a material includes at least one selected from the group comprising engineering thermoplastic, carbon nanotube and any combination thereof.

Figure 4:
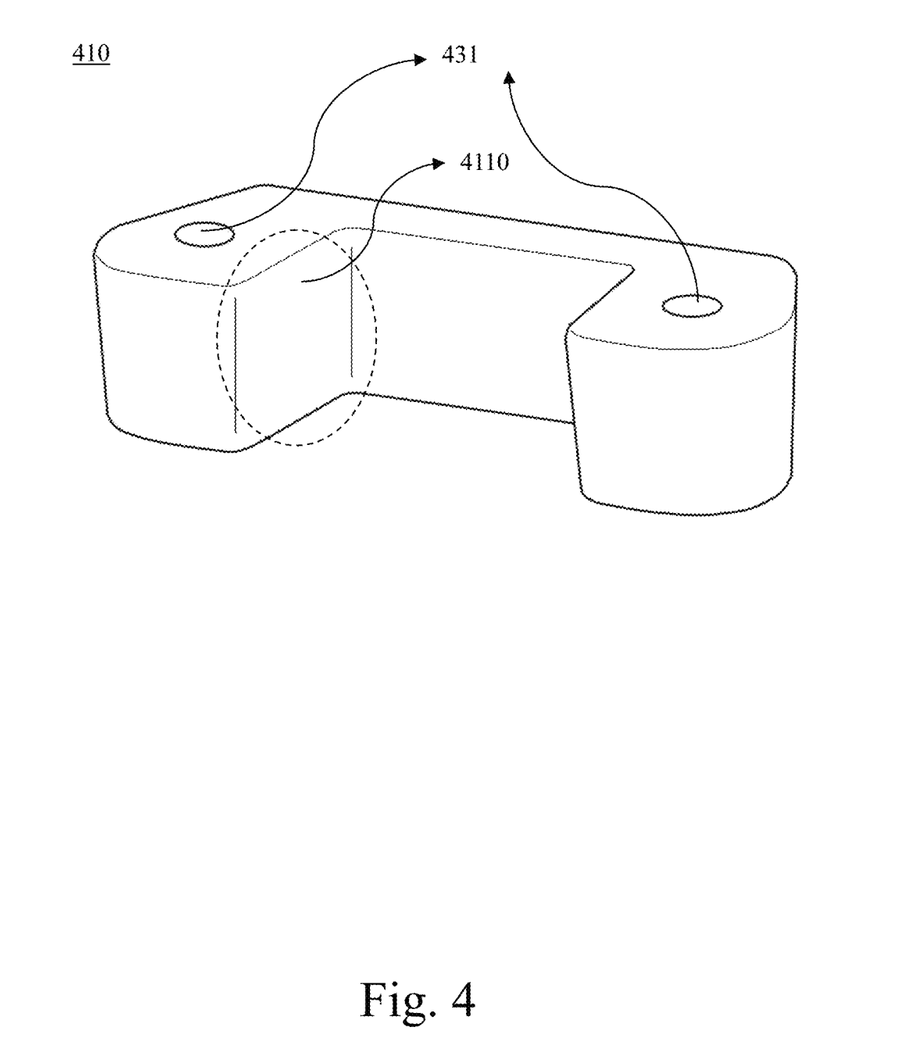
FIG. 4 shows a schematic diagram of the first wear part of the preferred embodiment of the invention.
Figure 7:
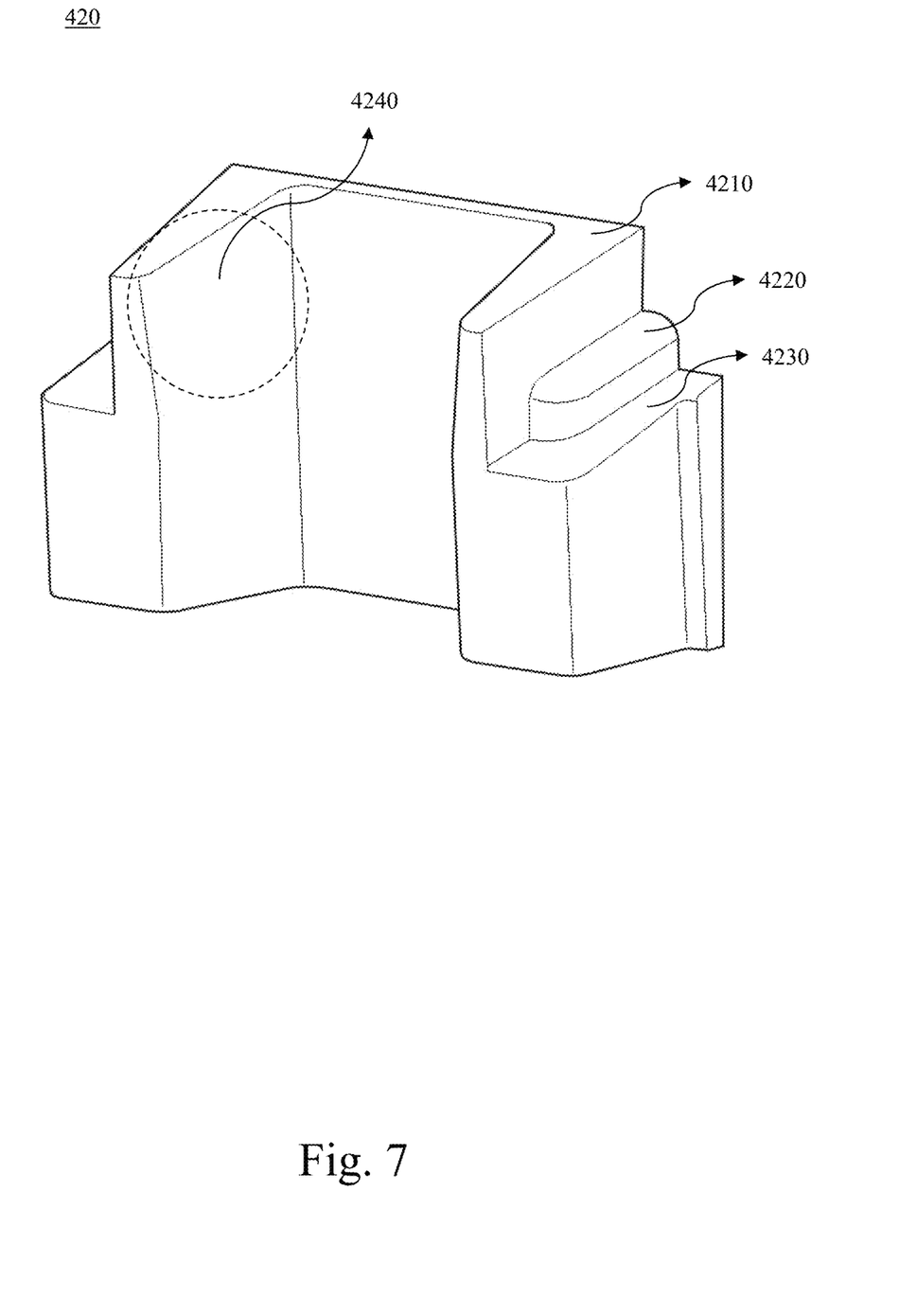
FIG. 7 illustrates a schematic diagram of the second wear part of the preferred embodiment of the invention.
Figure 8:
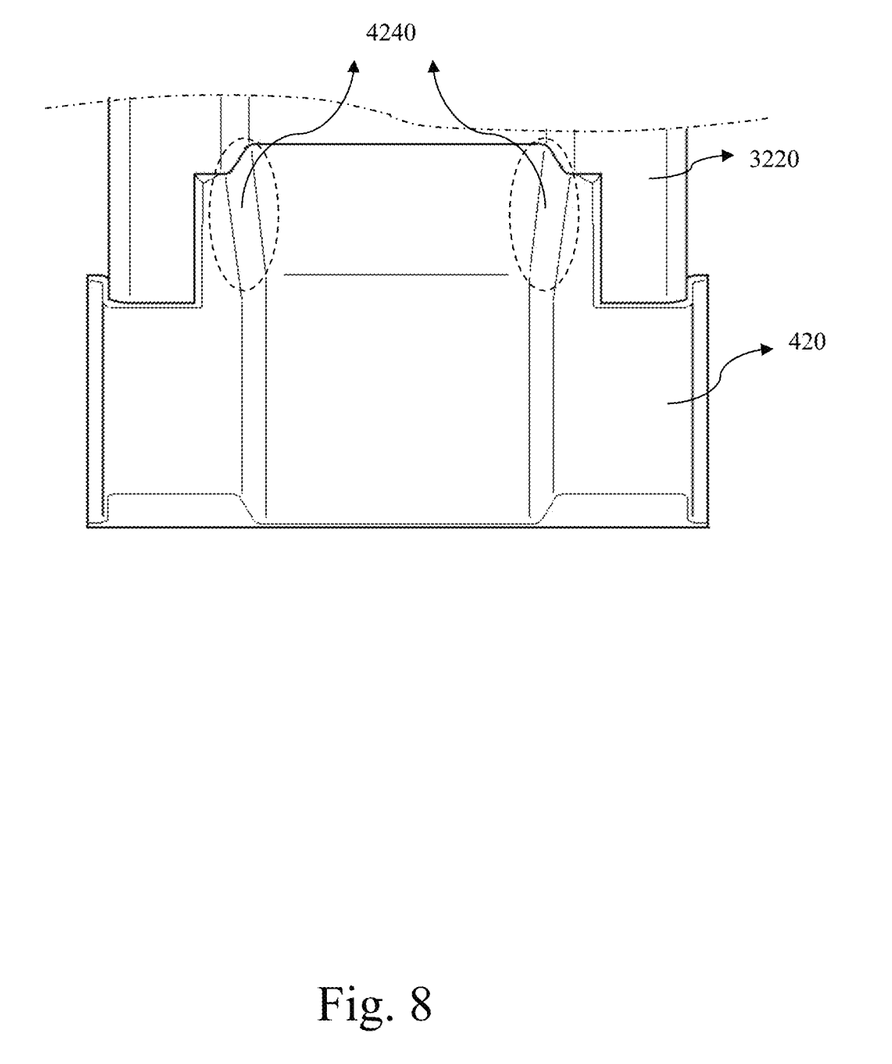
FIG. 8 illustrates a schematic diagram of disposing the second wear part onto the slots of one embodiment of the present invention.

In the present embodiment, please refer to the first wear part 410 illustrated in FIG. 4 and the second wear part 420 illustrated in FIG. 7; wherein the first wear part 410 and the second wear part 420 are made of a material includes at least one selected from the group comprising of engineering thermoplastic, carbon nanotube and any combination thereof. In one of the embodiments, please refer to FIG. 5, the first wear part 410 is disposed on the slots 3220 by the injection molding process or through the fastener 430 matching with the fixing hole 430.

Figure 5:
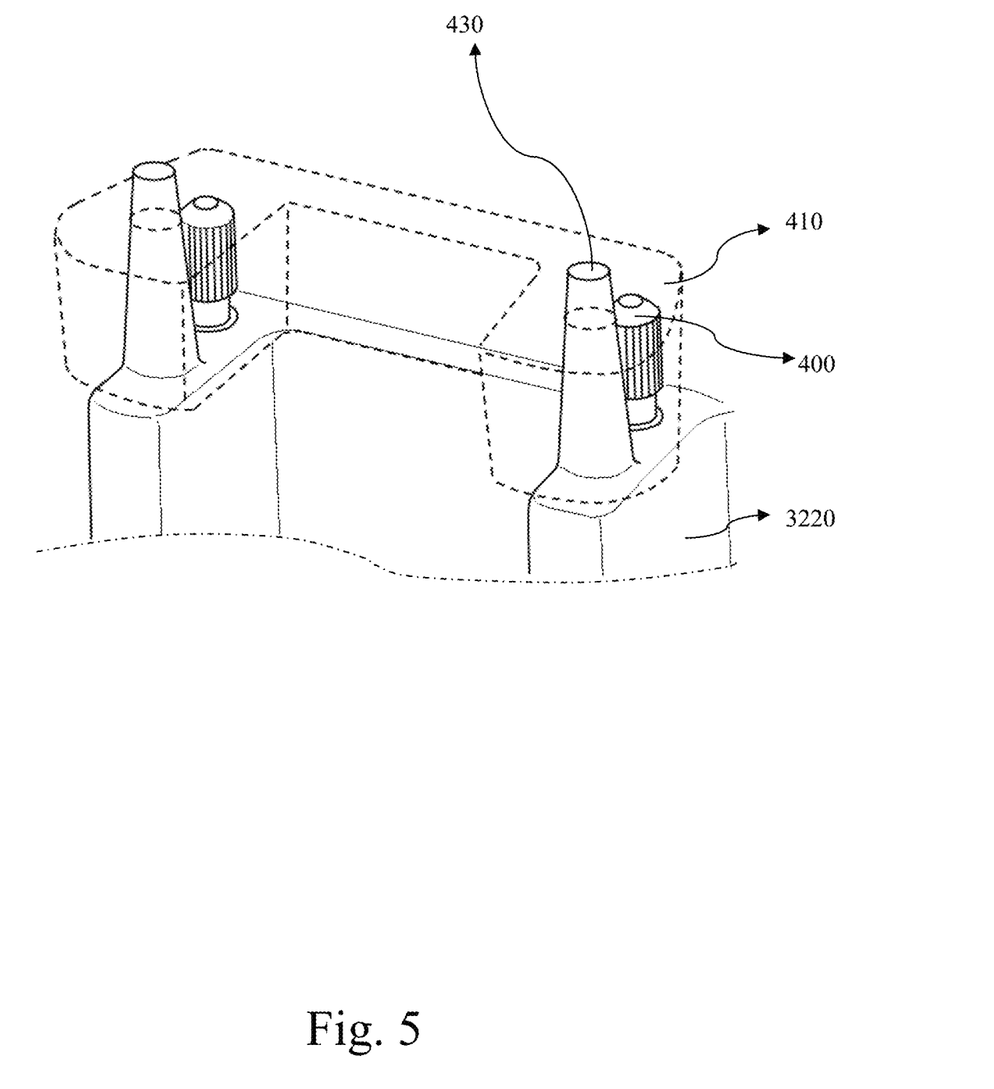
FIG. 5 illustrates a schematic diagram of disposing the first wear part onto the slots of one embodiment of the present invention.
Figure 6:
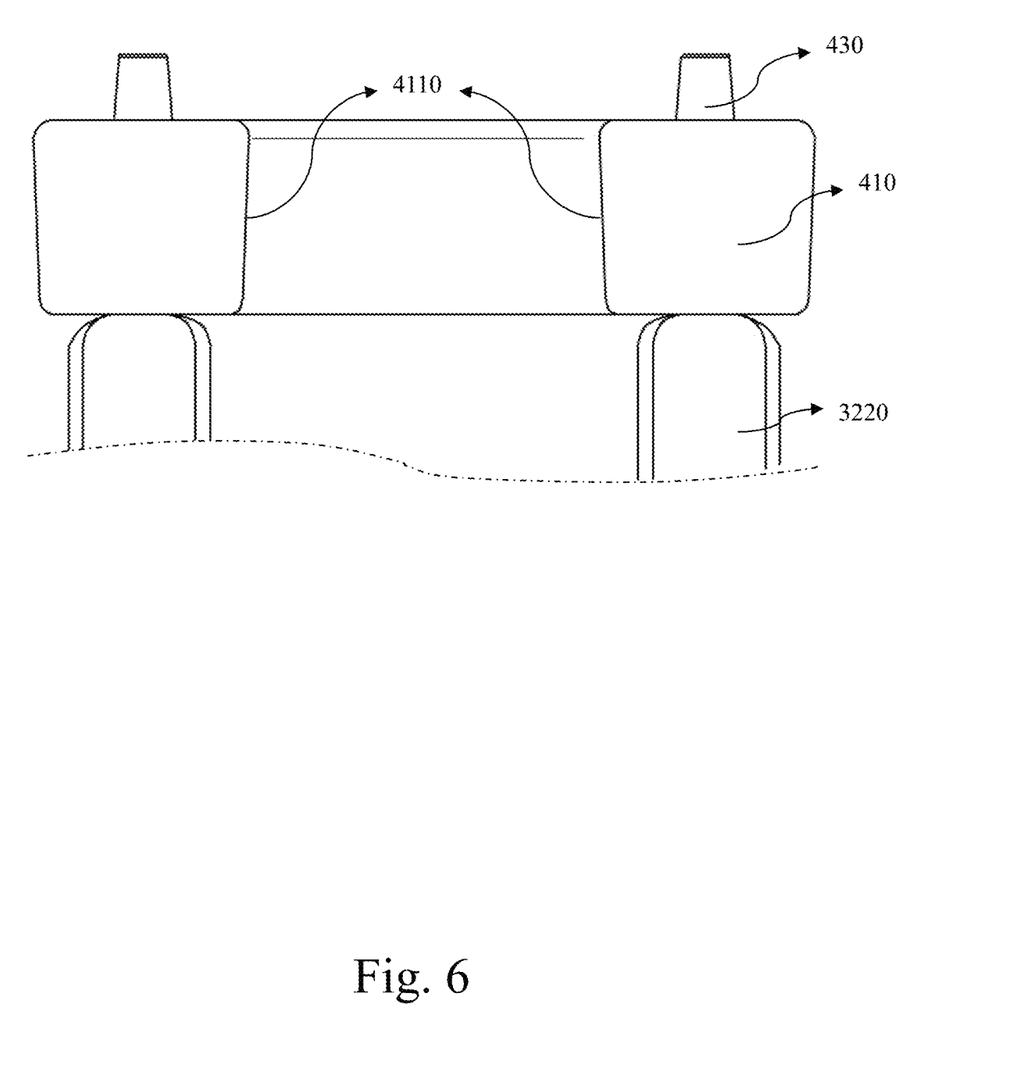
FIG. 6 illustrates a cross-section view of disposing the first wear part onto the slots of one embodiment of the present invention.

Furthermore, in one of the embodiments, when the first wear part 410 is disposed on the slot 3220 by the injection molding process, the first wear part 410 further includes an insert object 400, which is used to connect the first wear part 410 with the slots 3220. As shown in FIG. 5, the insert object 400 may be a counterweight member. To be more specific, the insert object 400 acts as a counterbalance to the weight of the first wear part 410 and increase stability. For example, the insert object 400 may be an ejector pin, a screw nut or any other metal embeds, which acts as a connector between the slots 3220 and the first wear part 410. In the other embodiment, if the first wear part 410 is embedded into the top of the slot 3220, the slots 3220 further include at least one fastener 430, which is used to fix the first wear part 410 onto the top of the slot 3220. In the present embodiment, at least two fasteners are required and each of the fastener 430 comprises a cone part which is the frustum of a cone that remains after its upper part has been cut by a plane parallel to its base. The abovementioned cone part matches with the corresponding fixing hole 431. For example, the fastener 430 and the top portion of the slot 3220 may be formed in one body, which is like a construction having a protruding part. Otherwise, the fastener 430 may be an additional element, such as a pin, a rivet or a bolt, and it is not intended to be exhaustive or to be limited to the above forms disclosed.

In the present embodiment, the first wear part 410 is appropriately positioned on the slot through the fixing hole 430 matching with the corresponding cone part of the fastener 430. Further, once the users put the first wear part 410 upside down, the cone part of the fastener 430 would fail to match with the fixing hole 431 and the users could recognize the wrong installation. Therefore, the structures of the cone part of the fastener 430 and the corresponding fixing hole 431 are a kind of fool-proof design, which facilitates the assembling when using the reticle pod 3.

Please refer to FIG. 4, FIG. 6, FIG. 7, FIG. 8 and FIG. 9. In the present embodiment, the first wear part 410 further comprises a first bevel 4110 which is the contacting surface with the reticle 5; the second wear part 420 further comprises a second bevel 4240 which is also the contacting surface with the reticle 5. The function of the first bevel 4110 and the second bevel 4240 is similar to the function of the third bevel 3221 which has been described previously. Likewise, the first bevel 4110 and the second bevel 4240 facilitate the loading of the reticles 5 into the reticle pod and reduce the consequent friction. In addition, as shown in FIG. 7, the second wear part 420 further includes at least one tenon in order to fix firmly the second wear part 420 at the bottom of the slots 3220. In the present embodiment, the second wear part 420 includes a first tenon 4210' a second tenon 4220 and a third tenon 4230 to facilitate fool-proof installation of the second wear part 420.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A reticle pod, comprising:
   a cover;
   a box, comprising a vertical accommodation space;
   wherein the box has at least one guiding member which matches with the cover;
   a plurality of slots, disposed in the vertical accommodation space in pairs;
   a wear parts module, configured on at least one of the plurality of slots;
   wherein the wear parts module adapted for directly contacting a plurality of reticles, and the wear parts module comprising:
      a first wear part, configured on an entrance of the at least one slot; and
      a second wear part, configured on the other side of the entrance of the at least one slot;
   wherein the first wear part further comprises a first bevel;
   wherein the second wear part further comprises a second bevel;
   wherein a third bevel is configured on connection between the second wear part and a middle portion of the at least one of the plurality of slots;
   wherein the first bevel and the second bevel facilitate loading of the plurality of reticles into the reticle pod.

2. The reticle pod as claimed in claim 1, wherein the cover and the box are made of electrostatic discharge material.

3. The reticle pod as claimed in claim 1, wherein handles are disposed outside the box in pairs.

4. The reticle pod as claimed in claim 1, wherein at least one fastener corresponding to at least one fixing hole is disposed on one side of the at least one slot, and the at least one fixing hole matches with the first wear part.

5. The reticle pod as claimed in claim 4, wherein the at least one fastener comprising a cone part which matches with wherein the at least one fixing hole.

6. The reticle pod as claimed in claim 1, wherein the first wear part is connected with one side of the at least one slot by at least one insert object.

* * * * *